United States Patent [19]

Wells

[11] Patent Number: 4,935,746

[45] Date of Patent: Jun. 19, 1990

[54] EFFICIENCY MONITORING ANTENNA

[76] Inventor: Donald H. Wells, 7134 Railroad St., Holland, Ohio 43528

[21] Appl. No.: 357,187

[22] Filed: May 26, 1989

[51] Int. Cl.[5] ........................ H01Q 1/32; G01R 27/06

[52] U.S. Cl. .................................... 343/703; 343/715; 343/745; 343/861; 343/894

[58] Field of Search ............... 343/703, 721, 894, 715, 343/713, 745, 749, 750, 860, 861

[56] References Cited

U.S. PATENT DOCUMENTS 3,540,057 11/1970 Persson et al. ...................... 343/703
3,909,830 9/1975 Campbell ............................ 343/703
4,167,738 9/1979 Kirkendall .......................... 343/703
4,280,129 7/1981 Wells .................................. 343/750

FOREIGN PATENT DOCUMENTS 234947 4/1986 German Democratic Rep. .................................... 343/703

*Primary Examiner*—Michael C. Wimer
*Attorney, Agent, or Firm*—William P. Hickey

[57] ABSTRACT

An efficiency monitoring antenna which has a sampling pick-up loop and LED coupled to the lead-in and senses and indicates returning power flow. Tuning and impedance matching elements are also included which allow the antenna to be tuned and matched to the transmission line.

11 Claims, 1 Drawing Sheet

EFFICIENCY MONITORING ANTENNA

TECHNICAL FIELD

The present invention relates to antennas the efficiency of which is subject to change after installation, or use; and so must be adjusted in place for its best performance.

BACKGROUND OF THE INVENTION

Antenna arrays, and whip antennas, and particularly those which are to be installed on vehicles, or near towers, and/or other metal objects have their impedance changed after installation. So far as I am aware, the only way that these antennas can be tuned is to measure their signal strength using a separate instrument, and then adjusting the impedance of the antenna accordingly. This may involve several trips to remote locations to adjust a transmiter, or receiver, or to check on the signal strength received.

An object of the present invention is the provision of a new and improved antenna assembly which needs no external monitoring instrument; and which assembly will indicate whether or not the antenna is properly tuned after it is installed.

A further object of the present invention is the provision of a new and improved antenna assembly of the above described type which is inexpensive to manufacture, rugged in its construction, and efficient in its operation.

Still further objects and advantages of the invention will become apparent to those skilled in the art to which the invention relates from the following description of the preferred embodiments described with reference to the accompanying drawings forming a part of this specification.

BRIEF SUMMARY OF THE INVENTION

According to principles of the present invention, a sampling pick-up loop is capacitively and/or inductively coupled to the antenna lead which connects the transmission line to the antenna element or transducer which changes a conductor current to a radiation field, and vice versa. It has been found that when such an antenna element is not properly tuned, a sufficient change occurs in the power flow from the transmission line to the transducer or vice versa to be sensed by the pick-up loop and operate a diode whose input and output are connected to the loop. The coupling can be made by a single wire that is so suprisingly short, that the diode and wire can be part of the antenna assembly to which the transmission line is connected.

DESCRIPTION OF THE PREFERRED EMBODIMENTS

Figure 5:
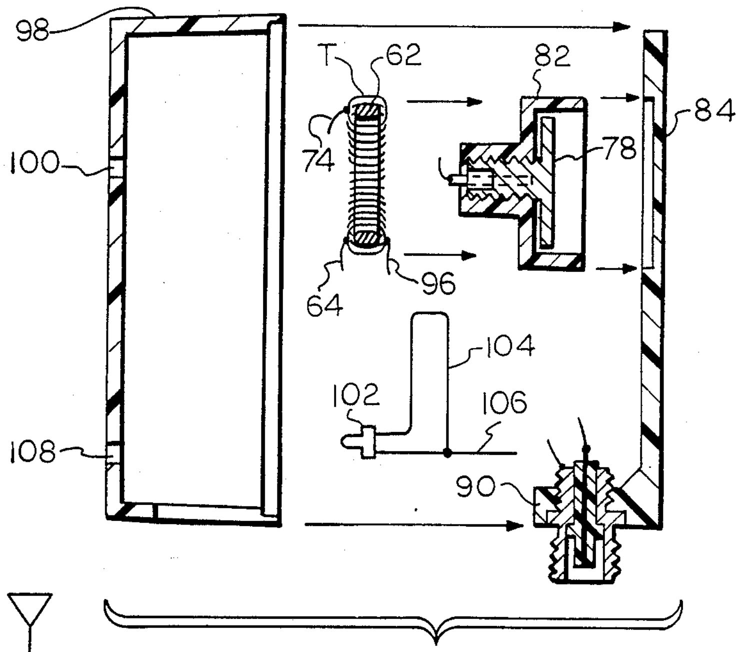
FIG. 5 is an exploded view of the parts shown in FIG. 4.
Figure 1:
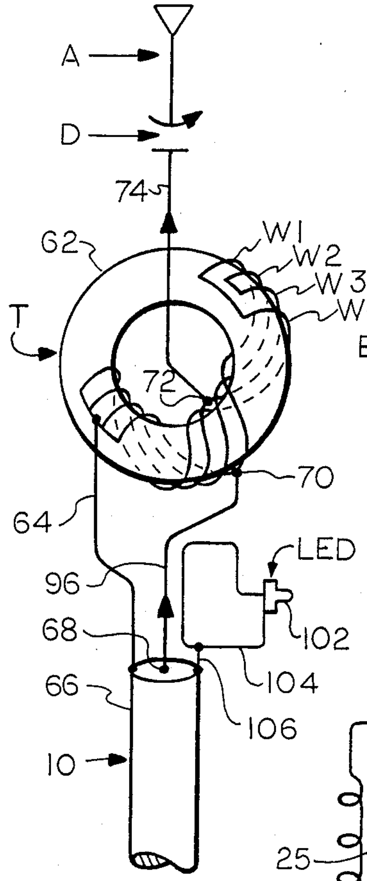
FIG. 1 is a schematic drawing of an antenna assembly which includes: the transmission line to antenna impedance matching transformer of my copending U.S. application Ser. No. 162,633, now abandoned, and the monitoring device of the present invention.
Figure 4:
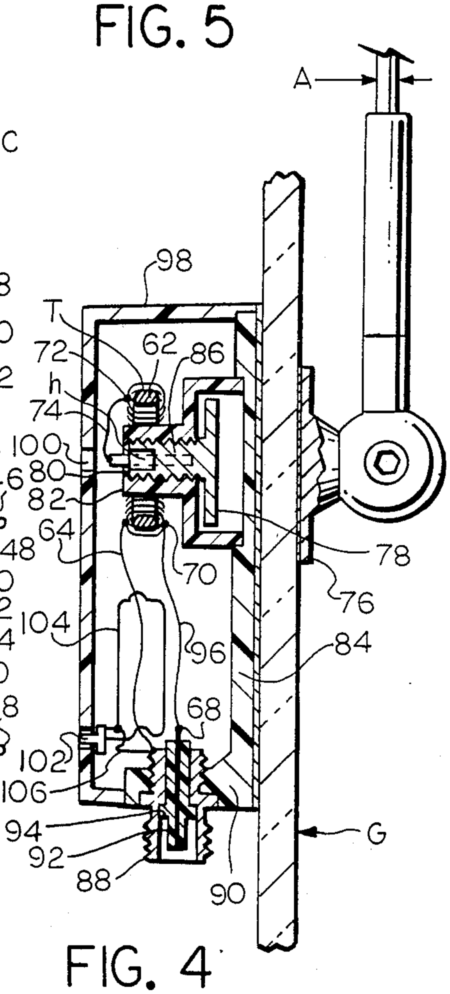
FIG. 4 is a sectional view of a practical embodiment of the invention depicted in FIG. 1.

A practical device of the type shown schematically in FIG. 1 is shown in detail in FIGS. 4 and 5. This device comprises an impedance matching transformer "T" which provides an input impedance matching that of the transmission line 10, and an output impedance matching that of the electric current to radiation field transducer "A", commonly referred to as an antenna.

According to the present invention, a monitoring system comprising an LED is incorporated into the antenna structure that is connected to a transmission line to indicate its state of tuning. This will be explained later in detail in conjunction with the description of FIGS. 4 and 5.

Figure 2:
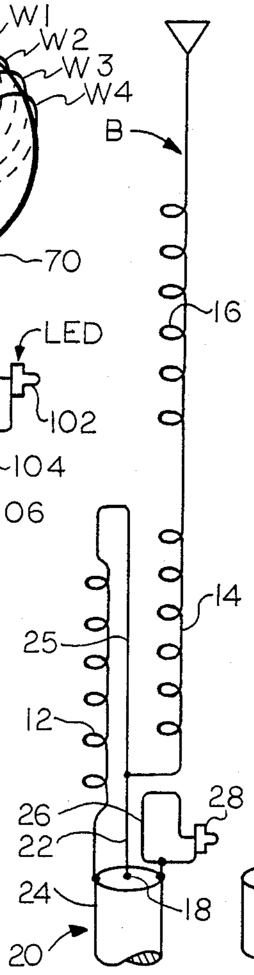
FIG. 2 is a schematic drawing of an antenna assembly of the type which needs no grounding and which is disclosed in my copending U.S. application Ser. No. 321,309, but is further modified to incorporate the monitoring device of the present invention.

The antenna assembly shown schematically in FIG. 2 comprises a structural whip, not shown, around the bottom end of which, is a bifilar winding which provides two coils 12 and 14 which are inductively and capacitively coupled. Above the bifilar windings 12 and 14 is another coil 16 which is part of the current to radiation field transducer "B". The top of coil 14 is connected to the transducer coil 16 and the bottom of coil 14 is connected to the center terminal 18 of a coaxial cable transmission line 20 by a short wire 22. A center conductor 25 connects the bottom of coil 14 to the top of coil 12, and the bottom of coil 12 is connected to the shielding 24 of the coaxial cable 20. This arrangement of bifilar windings provides an isolation transformer which isolates the transducer "B" from the shielding 24 to eliminate the need for grounding of the antenna at its juncture to the transmission line. If the coils 16 and 14 are of sufficient length to accomodate one half of a wave length of transmitted energy, and if a proper impedance match is provided to the transmission line, very little power will return from coil 14 through conductor 22.

According to the invention, a short loop of wire 26 is layed along, but insulated from, the conductor 22 and is connected to an LED 28 in such manner that only returning power lights up the LED 28. Normally, the LED remains nonconductive when power flows from the transmission line 20 to the transducer B. The limited capacitive coupling of conductor 26 protects the LED 28, and since the LED normally does not take power out of the conductor 22, the device does not reduce the efficiency of the antenna during normal operation.

Figure 3:
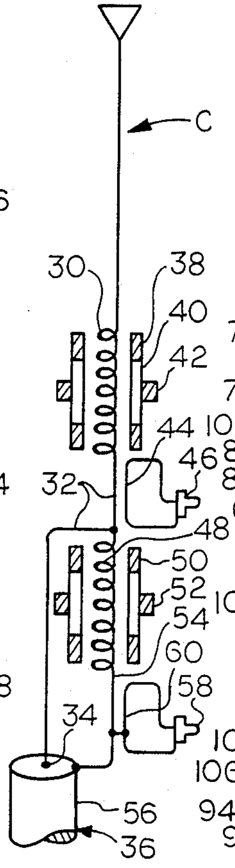
FIG. 3 is a schematic drawing of an antenna assembly having one adjustment for the impedance match between the electrical current and radiation field transducer, and another adjustment for the impedance match between the assembly and the transmission line, as disclosed in my U.S. Pat. 4,280,129, and further modified to incorporate the monitoring device of the present invention.

The antenna shown schematically in FIG. 3 is also supported on a structural whip, not shown. This device has an antenna coupling means comprising an upper coil 30 for changing the impedance at the base of the current to radiation field transducer C. The top end of the upper coil 30 is connected to the transducer, and the bottom end is connected by conductor 32 to the center conductor 34 of a coaxial cable 36.

Surrounding the upper coil 30 is a metal sleeve 38 having openings or windows 40 therein to let a limited amount of the magnetic field to escape. The outside surface of the sleeve 38 is threaded and a nut 42 is threaded onto the sleeve 38, so that it can be positioned longitudinally of the windows 40. The sleeve 38 shields the coil 30 from capacitive effects of surrounding structure, and the nut 42 intercepts flux at the window, so that the position of the nut 42 changes the impedance at the base of the coil 30. When coil 30 and transducer "C" are adjusted to accomodate one half of a wave length of transmitted energy, substantially no flow of current will return to conductor 32. As in the previously described embodiments, returning power is sensed by a short conductor loop 44 whose ends are connected to the terminals of an LED 46. The conductor 44 is connected to the LED 46 in such manner that power flow from the transmission line 34 to the transducer C does not light the LED 46. The LED does light however when power returns from the transducer C.

The embodiment of FIG. 3 has a second coil 48, sleeve 50, and nut 52 which are similar to coil 30, sleeve 38, and nut 42. Transmission line 34 is connected to the top of coil 48, and the bottom of coil 48 is connected by a short conductor 54 to the shielding 56 of the coaxial transmission cable 36. A second LED 58 is connected to a short conductor loop 60 that is placed adjacent conductor 54. LED 58 lights up when the impedance at the top of coil 48 does not match the impedance of the transmission cable 36.

A preferred embodiment of the device shown schematically in FIG. 1 is shown in FIGS. 4 and 5 of the drawing. The transformer T comprises a torus 62 of permeable material which is quadrafilar wound and with the ends of the windings suitably connected to provide two conductors having equal and opposite standing half waves. In addition, the transformer T feeds the transducer A through an antenna coupling means which in this case is a capacitor D that is adjustable to tune the antenna for maximum performance.

The transformer T is conveniently made by winding four color coded wires w1, w2, w3 and w4 each of a length to accomodate a one quarter wave length when wound on the permeable material, at the transmitted frequency. The four wires w1, w2, w3 and w4 are wound around the torus 62 following which one end of wires w2 and w3 are soldered together, and one end of wires w1 and w4 are soldered together. This provides two conductors each accomodating one half of a wave length of transmitted energy. Because the opposite ends of a standing half wave are at zero potential, the other ends of wires w1, w2, w3 and w4 can be connected together, and in turn be connected by conductor 64 to the outside conductor 66 of coaxial cable 10. The center conductor of coaxial cable 68 is connected to conductor w1 at an input terminal 70 having the characteristic impedance of coaxial cable 10. Conductor w3 is provided with an output terminal 72 at or near the characteristic impedance of the capacitor coupled antenna A. Conductor 74 connects terminal 72 to the variable capacitor D.

The antenna A is intended to be mounted on the outside of a vehicle, and the variable capacitor D is constructed and arranged to feed through a dielectric material such as glass or fiberglass G, as best seen in FIG. 4. The antenna A is pivotably supported on a base 76 that is cemented to the outside of the dielectric material G, and which forms one plate of the capacitor D. The opposite plate 78 of the capacitor D is carried by a threaded stem 80 that is threaded through a plastic cup 82. The open end of the plastic cup 82 is cemented to a plastic base 84 which in turn is cemented to the inside of the dielectric material G opposite plate 76. The stem 80 has a hexagonally shaped opening "h" therein by which the stem 80 and plate 78 can be threaded toward or away from the plate 76. A metal insert 86 engages the stem 80. Conductor 74 connects the output terminal 72 of transformer T to the metal insert 86. The transformer T which comprises torus 62 and wound conductors w1, w2, w3 and w4 surround the plastic cup 82 and are suitably affixed thereto.

The coaxial cable 10 can be connected to the transformer T in any suitable manner. Conveniently, a conventional coaxial connector comprising a threaded metal barrel 88 is held in a plastic pedestal 90 that is formed integrally with the base 84. An axially extending pin 92 is insulated from the barrel 88 by a plastic sleeve 94. One end of a signal conductor 96 is soldered to pin 92 and the other end is soldered to output terminal 70. Conductor 64 is soldered to barrel 88. A conventional coaxial cable end, not shown, is received into the lower end of barrel 88, and its nut, not shown, is threaded onto the outside of barrel 88. A cup shaped plastic cover 98 fits down over the transformer T and pedestal 90 and is cemented to the base 84 and pedestal 90. An opening 100 in the cover 98 opposite the stem 80 allows a tool to be inserted into the hexagonally shaped opening "h" in stem 80 for adjusting the position of plate 78.

Conductors w1 and w2 each accomodate a one quarter wave length, and because they are connected in series, w1 and w4 accomodate a one half wave length. The same is true for w2 and w3. Because the beginning, center, and end of a full wave length are at neutral potential, both ends of now joined conductors w1 and w4, and now joined conductors w2 and w3 can be grounded. It is desired that variable capacitor D will be tuned so that the full standing wave will stay in the conductors w1, w2 and w3 and w4 which form the impedance transformer T. When A is transmitting and D is properly adjusted, maximum power will flow through conductor 96 and practically none will be reflected back through conductor 96 to conductor 68.

According to the invention, a return flow through conductor 96 is sensed by an LED 102, the input and output of which are connected to the ends of a loop conductor 104. Conductor 104 is approximately two inches long, with approximately one inch of conductor 104 being bound adjacent, but insulated from, conductor 96. The connections to LED 102 are such that it conducts and lights up when power flows down from transformer T to conductor 68. The loop conductor 104 is tied to ground at an approprate point by a conductor 106 that is soldered to barrel 88 to which shielding 66 is connected. LED 102 fits into an opening 108 in the plastic cover 98.

FIG. 5 shows the various pieces of the transformer T and capacitor D in intermediate stages of assembly. The cup 82 containing the plate 78 is cemented to the base 84, the wound torus 62 is fixed around the cup 82, and the conductors 64, 74, 96 and 106 are soldered to their respective terminals. Thereafter the LED 102 is cemented in hole 108 and the cover 98 is telescoped into position over the internal parts and is cemented in place.

It will be seen that the embodiment shown in FIGS. 4 and 5 can be used to handle frequencies having relatively long standing waves, as occur in lower frequencies, because of the use of the permeable material, and the long length of wires w1, w2, w3 and w4 which can be wound onto the torus 62.

While the invention has been described as arranged to cause an LED to go out when the impedance at the base of an antenna, or end of a transmission line, as the case may be, are properly adjusted, it will be understood that the LEDs can be arranged to light up normally and go out when improper adjustment prevents maximum flow of power. Half wave length antennas are voltage fed, and when properly tuned have maximum voltage at their base. In this case, capacitive coupling of the sampling loop to the base of the antenna is very sensitive to voltage peak and the direction of power flow. Quarter wave length antennas have a voltage node at their base, and capacitive coupling of the sampling loop to the base of the antenna can be made sensitive to voltage at the base of the antenna. It will also be understood that the LEDs can be coupled to other points of the antenna assembly to sense changes in conditions at other locations. For example, the LEDS could monitor the current flow from transformer T to the shielding of cable 10. It will also be understood that other simple means, such as a diode and transistor can be substituted for the LED in such manner that the transistor will be turned on by current flow in the proper direction. The transistor can then transmit the tuned condition to a remote location.

While the invention has been described in considerable detail, I do not wish to be limited to the particular embodiments shown or described, and it is my intention to cover hereby all novel adaptations, modifications, and arrangements thereof which come within the practice of those skilled in the art to which the invention relates, and which come within the purview of the following claims.

I claim:

1. An efficiency monitoring antenna comprising: an antenna element for converting radiation fields and electrical conductor currents from one to the other and connected to an antenna coupling means therefor; a support for mounting adjacent the bottom of said antenna element; a transmission line terminal fixed to said support; a transformer for matching the impedance of a transmission line to that of the antenna coupling means, said transformer including first and second conductors each accomodating approximately one half of a wave length of transmitted energy, said first and second conductors having ends connected together to form a closed loop providing impedance values which vary around the loop, a third conductor connecting said transmission line terminal to said loop at a point where said loop has the approximate impedance of said transmission line; said antenna coupling means being connected to said loop at a point having an impedance approximately matching that of said antenna coupling means attached to said antenna element; a fourth conductor coupled to said third conductor; means on said support for indicating power flow in said fourth conductor when power flows from said loop to said transmission line terminal; and tuning means on said support for tuning said antenna; and whereby said tuning means can adjust the impedance at said third conductor to a level which does not cause said means to indicate flow.

2. The efficiency monitoring antenna of claim 1 wherein: said means is an LED.

3. The efficiency monitoring antenna of claim 1 wherein: said tuning means comprises a variable capacitor between said transformer and said antenna element.

4. The efficiency monitoring antenna of claim 3 wherein: said first and second conductors are coils and comprise an isolation transformer.

5. An efficiency monitoring antenna for connection to a transmission line of characteristic impedance, comprising: an antenna element for converting radiation fields and electrical conductor currents from one to the other and producing a standing wave therein; a support for mounting adjacent the base of said antenna element and having first and second transmission line terminals fixed thereto; first and second conductors each having a length to accommodate one half of a standing wave of transmitted energy, said conductors being connected together to form a closed loop and with one end of said loop being connected to said first transmission line terminal; said antenna element being connected to said loop at a point having an impedance approximately matching that of said antenna element; a third conductor connecting said second transmission line terminal to said loop at a point having an impedance approximately matching that of the transmission line; a diode having input and output terminals arranged to sense direction of current flow; and a fourth conductor coupled to said third conductor and connected between said input and output terminals of said diode.

6. The efficiency monitoring antenna of claim 5 wherein: said diode is an LED and said fourth conductor and diode are arranged to conduct when power flows in said third conductor from said loop to said second transmission line terminal.

7. An efficiency monitoring antenna that needs no ground, said antenna comprising: an antenna element for converting radiation fields and electrical conductor currents from one to the other; a structural whip, said antenna element being mounted on said whip; a first transmission line terminal carried by said whip; first and second bifilar wound coils on said whip with said first coil being connected at one end to said antenna element; a first conductor connecting said first transmission line terminal to the other end of said first coil; a second transmission line terminal with the second of said bifilar coils connecting said first conductor to said second transmission line terminal; a light emitting diode having input and output terminals for sensing direction of current flow; and a second conductor connected to said light emitting diode and inductively coupled to said first conductor; said second conductor and light emitting diode being constructed and arranged to sense power returning from said first coil.

8. An efficiency monitoring antenna, comprising: an antenna element for converting radiation fields and electrical conductor currents from one to another; first and second transmission line terminals; first and second tuning coils each having input and output ends; a first conductor connecting said second terminal to said input end of said first coil; a second conductor connecting said output end of said first coil to said input end of said second coil, said output end of said second coil being connected to said antenna element; a third conductor connecting said first transmission line terminal to said output end of said first coil; a first diode having input and output terminals; a fourth conductor connected between said input and output terminals of said diode and coupled to said second conductor; a second diode having input and output terminals; and a fifth conductor connected between said input and output terminals of said second diode and coupled to said first conductor for sensing direction of current flow in said first conductor.

9. The efficiency monitoring antenna of claim 8 wherein: said second diode is an LED that is conductive when power flows from said first coil to said second transmission line terminal.

10. The efficiency monitoring antenna of claim 9 including: tuning means for said first and second tuning coils.

11. The efficiency monitoring antenna of claim 10 wherein: said tuning means comprises respective shields around respective tuning coils, each shield having a window therein; and said antenna including respective metallic rings for positioning longitudinally of respective windows.

* * * * *